United States Patent [19]

Tani

[11] Patent Number: 5,202,841
[45] Date of Patent: Apr. 13, 1993

[54] LAYOUT PATTERN VERIFICATION SYSTEM

[75] Inventor: Takahiro Tani, Itami, Japan

[73] Assignee: Mitsubishi Denki Kabushiki Kaisha, Tokyo, Japan

[21] Appl. No.: 544,901

[22] Filed: Jun. 28, 1990

[30] Foreign Application Priority Data

Jul. 14, 1989 [JP] Japan .................. 1-183212
Feb. 7, 1990 [JP] Japan .................. 2-29151

[51] Int. Cl.$^5$ ............................. G06F 15/60
[52] U.S. Cl. ................... 364/491; 364/490; 364/489; 364/488
[58] Field of Search ............ 364/488, 489, 490, 491, 364/578

[56] References Cited

U.S. PATENT DOCUMENTS

| | | | |
|---|---|---|---|
| 4,584,653 | 4/1986 | Chih et al. | 364/491 |
| 4,651,284 | 3/1987 | Watanabe et al. | 364/491 |
| 4,939,681 | 7/1990 | Yokomizo et al. | 364/488 |
| 5,046,012 | 9/1991 | Morishita et al. | 364/491 |
| 5,062,054 | 10/1991 | Kawakami et al. | 364/489 |

OTHER PUBLICATIONS

"Principles of CMOS VLSI Design", Neil H. E. Weste & Kamran Eshraghian.

Dracura User's Reference Manual, Cadence Design System, Inc.
"Resistance Extraction in a Hierarchical IC Artwork Vertification System" by S. Mori, IEEE 1985, pp. 196-198.
"Excl: A Circuit Extractor for IC Designs" by S. P. McCormick, IEEE 21st Design Automation Conf., 1984, pp. 616-623.
"LAS: Layout Pattern Analysis System with New Approach" by Y. Okamura et al., IEEE 1982, pp. 308-311.

Primary Examiner—Vincent N. Trans
Attorney, Agent, or Firm—Oblon, Spivak, McClelland, Maier & Neustadt

[57] ABSTRACT

In the inventive layout pattern verification system, verification data employed by a verification data judging part for judging effectiveness/defectiveness of the electrical property of a logic circuit formed by a layout pattern are data calculated by a verification data calculation part on the basis of reference circuit constants extracted from layout pattern data by a second data extraction part and process parameters supplied by a process parameter supply part, i.e., data obtained with no circuit simulation. Thus, the electrical property of the layout pattern of a large-scale logic circuit can also be easily verified by judging effectiveness/defectiveness of the electrical property of the logic circuit formed by a layout pattern through a verification data judging part on the basis of the verification data.

11 Claims, 12 Drawing Sheets

LAYOUT PATTERN VERIFICATION SYSTEM

BACKGROUND OF THE INVENTION

1. Field of the Invention

The present invention relates to a layout pattern verification system for verifying the electrical property of a layout pattern forming a prescribed logic circuit.

2. Description of the Prior Art

FIG. 1 is a block diagram showing a conventional layout pattern verification system for a logic circuit. As shown in the figure, circuit connection data D1 of a logic circuit corresponding to a layout pattern to be subjected to layout verification are taken in circuit constant extraction means 1, while data D2 of the layout pattern to be subjected to layout verification are taken in another circuit constant extraction means 2. When the object of layout pattern verification is transistor size, for example, channel length L1 and channel width W1 of a transistor 10 are taken in the circuit constant extraction means 1 from circuit connection data D1 typically shown in FIG. 2, while channel length L2 and channel width W2 are taken in the circuit constant extraction means 2 from layout pattern data D2 typically shown in FIG. 3. Referring to FIG. 3, numeral 11 denotes a diffusion region and numeral 12 denotes a polysilicon region, and an overlapping part of these regions 11 and 12 serves as a transistor (gate) forming region 13 of the transistor 10.

Circuit constants (L1, W1, L2 and W2 in the example shown in FIGS. 2 and 3) obtained by the extraction means 1 and 2 are taken in a verification part 3. The verification part 3 compares verification data obtained from the circuit constant extraction means 1 with verification data obtained from the circuit constant extraction means 2, thereby to verify whether or not the layout pattern is correctly designed. When an error is determined, it outputs an error list EL describing a designation specifying the transistor, a gain coefficient ratio and the like. In the example shown in FIGS. 2 and 3, the layout pattern is verified by comparing the channel length L1 and the channel width W1 with the channel length L2 and the channel width W2 respectively. If L1=L2 and W1=W2, it is determined that the layout pattern is correctly designed. If L1≠L2 or W1≠W2, on the other hand, the error list EL is outputted. When the error list EL is thus outputted, the designer can correct the layout pattern with reference to the error list EL, thereby to change the layout pattern data D2 in order to implement an intended circuit.

The conventional layout pattern verification system for a logic circuit having the aforementioned structure merely verifies dimensional characteristics, such as the transistor size, of an element forming a logic circuit.

In order to also guarantee the electrical property of the logic circuit in the designed layout pattern, it is necessary to separately execute circuit simulation on the basis of the circuit connection data D1.

However, if the logic circuit to be verified has large scale circuit structure, it is extremely unrealistic to carry out circuit simulation. To this end, it is impossible to guarantee the electrical property of the logic circuit in the layout pattern verification system under the present circumstances.

Further, it is necessary to change dimensional characteristics such as the transistor size (channel length and channel width) with respect to the circuit connection data D1 at any time following refinement of aluminum interconnection, formation width of a polysilicon layer and the like as cell as change in design rule of a wafer process due to technical development etc.

SUMMARY OF THE INVENTION

The present invention is directed to a layout pattern verification system for verifying the electrical property of a layout pattern forming a prescribed logic circuit.

The layout pattern verification system according to the present invention comprises connection data supply means for supplying circuit connection data defining connection relation between elements forming the logic circuit and large-small relation in charge supply capability of specific elements, layout pattern data supply means for supplying layout pattern data defining the layout pattern of the logic circuit, process parameter supply means for supplying various process parameters required for steps of fabricating the logic circuit, first data extraction means for extracting the specific elements those large-small relation in the charge supply capability is defined from the circuit connection data as verification elements, second data extraction means for extracting circuit constants relating to charge supply capability of the verification elements from the layout pattern data as reference circuit constants, verification data calculation means for calculating verification data expressing the charge supply capability ratio of the verification elements on the basis of the reference circuit constants and the process parameters, and verification data judging means for judging effectiveness/defectiveness of the electrical property of the logic circuit formed by the layout pattern on the basis of the verification data.

According to the present invention, verification data employed in verification data judging means for determining whether the electrical property of a logic circuit formed by a layout pattern is effective or defective are calculated by verification data calculation means on the basis of reference circuit constants extracted from layout pattern data by second data extraction means and process parameters supplied by process parameter supply means. Thus, it can be said that the verification data are obtained with no circuit simulation.

Accordingly, an object of the present invention is to obtain a layout pattern verification system which can verify the electrical property of a layout pattern of a large-scale logic circuit with circuit connection data having no dimensional characteristics of a circuit forming element.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
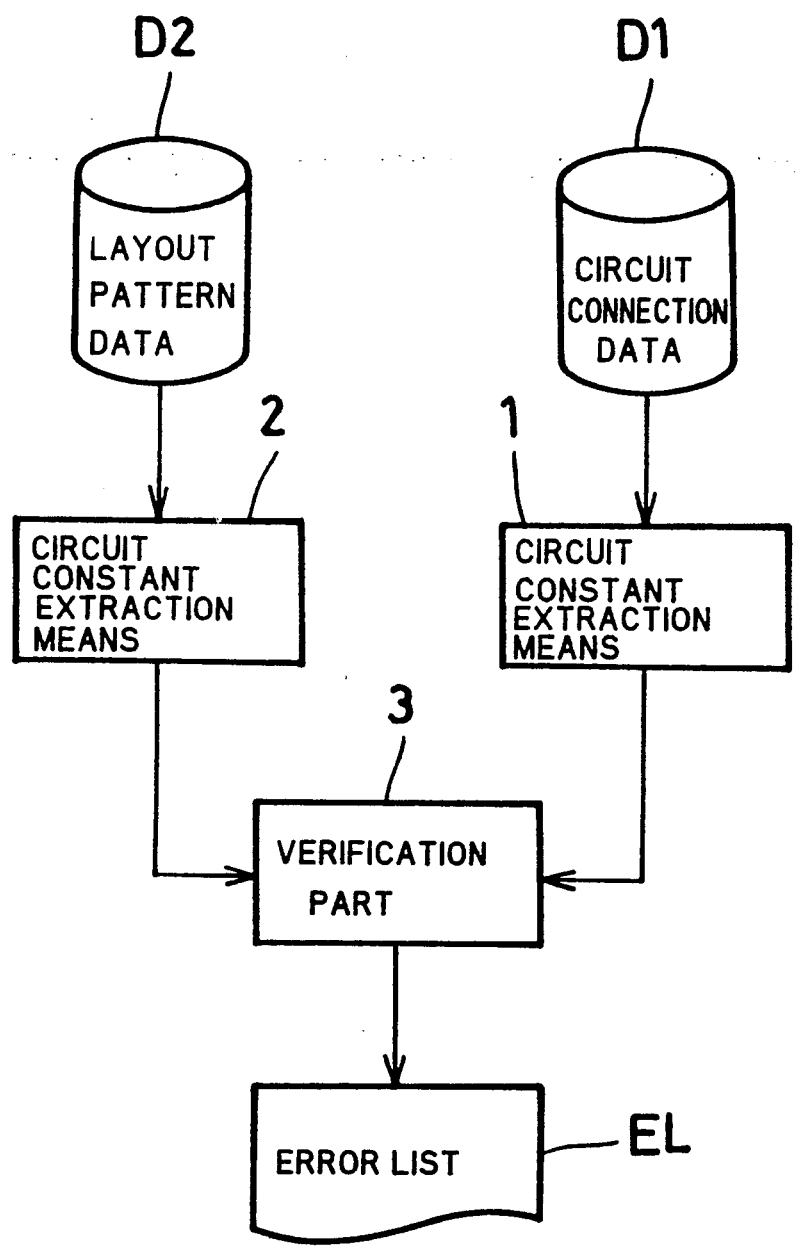
FIG. 1 is a block diagram showing a conventional layout pattern verification system.
Figure 2:
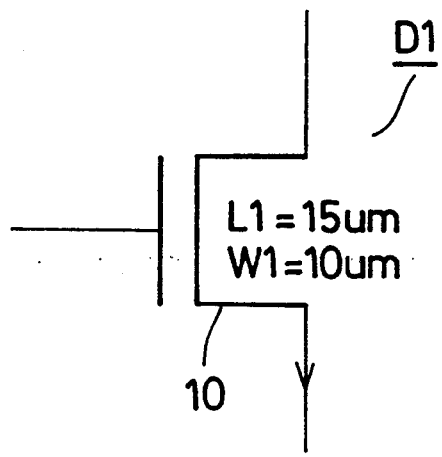
FIG. 2 is a circuit diagram showing conventional circuit connection data.
Figure 3:
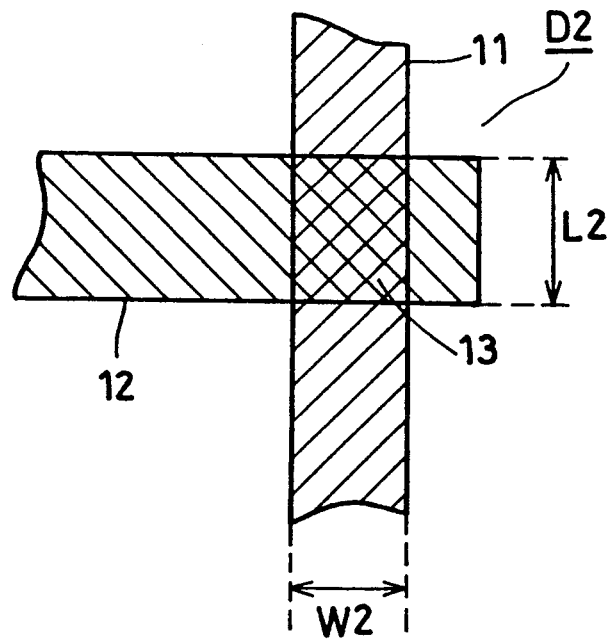
FIG. 3 is a plan view showing a layout pattern corresponding to the conventional circuit connection data.
Figure 4:
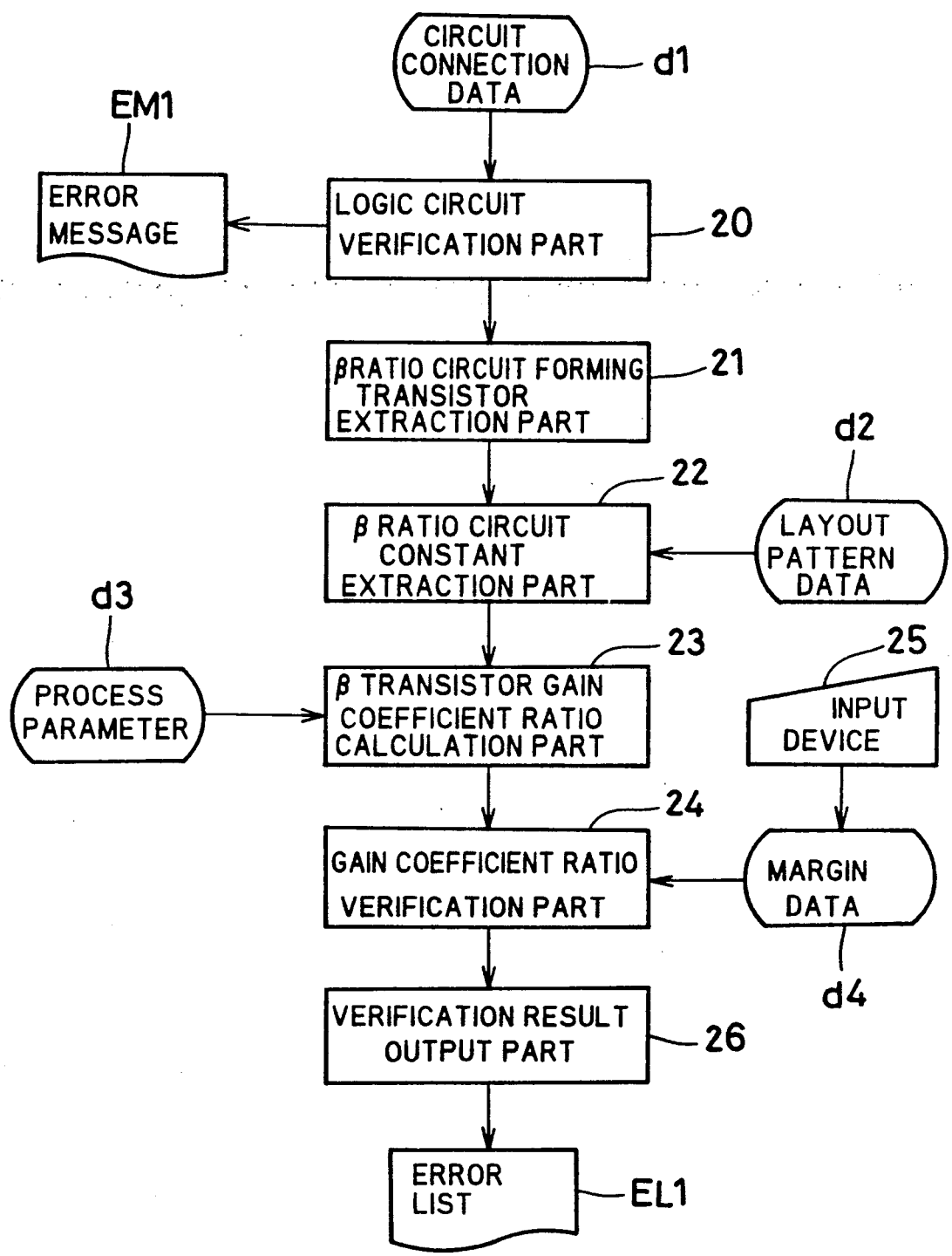
FIG. 4 is a block diagram showing a layout pattern verification system according to a first embodiment of the present invention.

FIG. 4 is a block diagram showing a layout pattern verification system according to a first embodiment of the present invention, which is adapted to verify a gain coefficient ratio of transistors in a $\beta$ ratio circuit forming a ratio circuit by the gain coefficient ratio.

Figure 5:
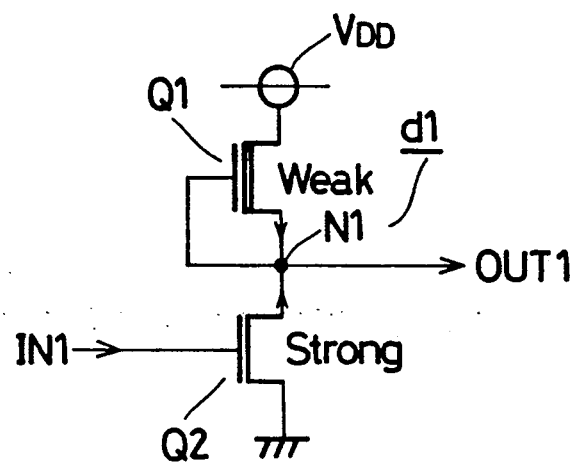
FIG. 5 is a circuit diagram showing an exemplary $\beta$ ratio circuit in circuit connection data.

As shown in the figure, circuit connection data d1 of a logic circuit corresponding to a layout pattern to be subjected to layout verification are taken in a logic circuit verification part 20. FIG. 5 typically shows an exemplary $\beta$ ratio circuit of the circuit connection data d1. As shown in FIG. 5, series-connected n channel MOS transistors Q1 and Q2 are interposed between a power source $V_{DD}$ and ground. The transistor Q1 of a depletion type has a drain which is connected to the power source $V_{DD}$ and commonly connected gate and source. On the other hand, the transistor Q2 of an enhancement type has a grounded source and a gate to which an input signal IN1 is applied. A signal obtained from a node N1 between the source of the transistor Q1 and the drain of the transistor Q2 serves as an output signal OUT1. Further, it is described that the signal strength level of the transistor Q2 as a charge supplying capability representing value is relatively "large" (strong) and the signal strength level of the transistor Q1 is relatively "small" (weak).

When a low-level input signal IN1 is inputted in this $\beta$ ratio circuit, the transistor Q1 is turned on and the transistor Q2 is turned off, whereby a high level output signal OUT1 is obtained. When a high-level input signal IN1 is inputted, on the other hand, both the transistors Q1 and Q2 are turned on. At this time, the transistor Q2 is turned on stronger since the signal strength level of the transistor Q2 is stronger than that of the transistor Q1 and guides the potential of the node N1 to the ground level, whereby a low-level output signal OUT1 is obtained. Thus, an inverter of the $\beta$ ratio circuit is so structured that output signal values of different strength levels compete with each other at the node N1 between the source of the transistor Q1 and the drain of the transistor Q2.

As hereinabove described, the circuit connection data d1 verified its logical circuit operation define no dimensional characteristics such as the channel length values, channel width values etc. of the transistors Q1 and Q2 dissimilarly to the conventional circuit connection data D1, but merely explicate that the transistor Q2 is larger in signal strength level than the transistor Q1.

The logic circuit verification part 20 verifies whether the logic circuit defined by the aforementioned circuit connection data d1 can correctly operate, by performing logic simulation. Therefore, it is possible to previously confirm whether charge supplying capability representing values and the like of the circuit connection data are correctly described, by the logic circuit verification part 20. That is, the logic circuit verification part 20 conducts logic simulation to output the circuit connection data d1 as it is to the $\beta$ ratio circuit forming transistor extraction part 21 when determining that the logical operation of the logic circuit defined by the circuit connection data d1 is normally performed, and to output an error message EM1 to call the designer's attention to the correction of the circuit connection data d1 when determining that the logical operation is not normally performed.

The $\beta$ ratio circuit forming transistor extraction part 21 extracts transistors (hereinafter referred to as "transistors") (Q1 and Q2 in the example shown in FIG. 5) forming the $\beta$ ratio circuit from the circuit connection data d1 shown in FIG. 5, to perform designation of the extracted transistors with respect to a ratio circuit constant extraction part 22 of a subsequent stage.

The $\beta$ ratio circuit constant extraction part 22 extracts circuit constants of the $\beta$ transistors designated by the $\beta$ ratio circuit forming transistor extraction part 21 from layout pattern data d2.

Figure 6:
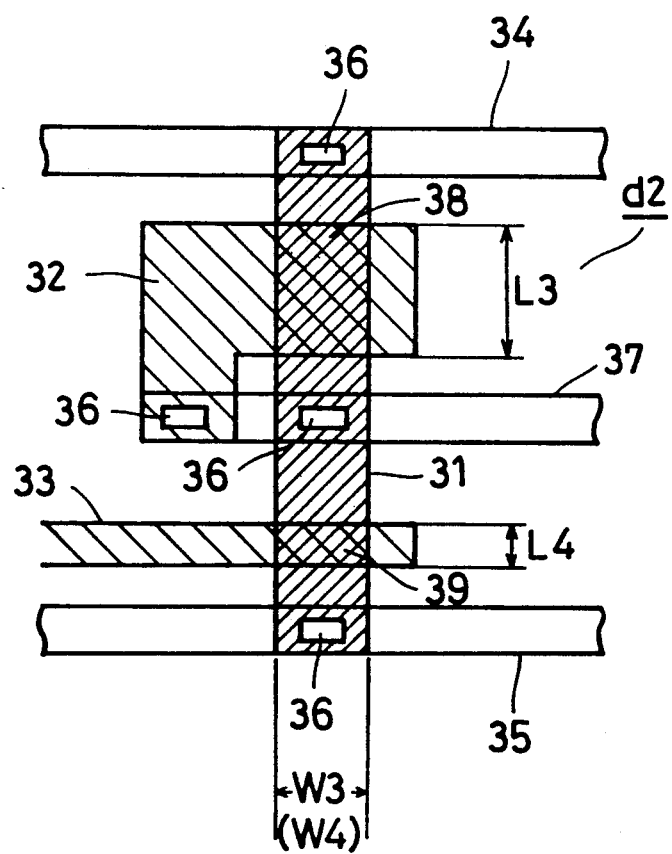
FIG. 6 is a plan view showing layout pattern data corresponding to FIG. 5.

FIG. 6 is a plan view typically showing the layout pattern data d2 in a portion corresponding to the circuit connection data d1 shown in FIG. 5. Referring to the figure, numeral 31 denotes a diffusion region and numerals 32 and 33 denote polysilicon regions. The input signal IN1 is applied to the polysilicon region 33. Numeral 34 denotes an Al power supply line, numeral 35 denotes an Al-GND line, numeral 36 denotes a contact part, and numeral 37 denotes an output Al signal line. An overlapping region 38 of the diffusion region 31 and the polysilicon region 32 serves as a gate forming region of the transistor Q1, while an overlapping region 39 of the diffusion region 31 and the polysilicon region 33 serves as a gate forming region of the transistor Q2. The $\beta$ ratio circuit constant extraction part 22 extracts channel length L3, channel length L4, channel width W3 and channel width W4 which are circuit constants of the transistors Q1 and Q2 forming the $\beta$ ratio circuit, from such layout pattern data d2, and outputs the same to a $\beta$ transistor gain coefficient ratio calculation part 23 of a subsequent stage.

The $\beta$ transistor gain coefficient ratio calculation part 23 calculates gain coefficient ratios of the transistors by employing process parameters d3, which are parameters such as impurity concentration, film thickness etc. of a semiconductor layer to be formed and required for steps of manufacturing a logic circuit formed by the layout pattern on the basis of the circuit constants of the transistors obtained from the $\beta$ ratio circuit constant extraction part 22. The calculation procedure is now described with reference to the β ratio circuit shown in FIGS. 5 and 6.

A gain coefficient of a transistor is generally supplied by the following expression (1):

$$\beta = \frac{\mu\epsilon}{t_{OX}} \cdot \left(\frac{W}{L}\right) \tag{1}$$

L: channel length
W: channel width
μ: effective degree of surface migration of electrons in channel
ε: dielectric constant of gate oxide film
$T_{OX}$: to thickness of gate oxide film μ represents a constant held in the β transistor gain coefficient ratio calculation part 23 and ε and $t_{OX}$ can be obtained from the process parameters d3, while L and W can be obtained from the layout pattern data d2 as hereinabove described. Respective gain coefficients β1 and β2 of the transistors Q1 and Q2 are obtained on the basis of the expression (1), thereby to obtain a gain coefficient ratio β1/β2.

The β transistor gain coefficient ratio calculation part 23 thus obtains the gain coefficient ratio, and outputs the same to a gain coefficient ratio verification part 24. The gain coefficient ratio verification part 24 takes in margin data d4 and compares the same with the gain coefficient ratio taken in from the β transistor gain coefficient ratio calculation part 23, thereby to judge whether the electrical property of the β ratio circuit is effective or defective. The margin data d4 is set by a designer inputting the same through an input device 25 in consideration of margins (noise margin etc.) required for normal operation of a logic gate subsequent to the β ratio circuit.

When the margin data d4 of the gain coefficient ratio β1/β2 of the transistors Q1 and Q2 is set below 1/5, for example, in the β ratio circuit shown in FIGS. 5 and 6, the gain coefficient ratio verification part 24 regards that operating condition is sufficiently satisfied and judges that the electrical property of the ratio circuit is "effective" if β1/β2 1/5. while judging that the electrical property of the β ratio circuit is "defective" if β1/β2>1/5, to output the result of the judgement to a verification result output part 26.

When the result of judgement of "defective" is obtained, the verification result output part 26 outputs an error list EL1 describing designations specifying the "defective" transistors and the gain coefficients of the transistors on the basis of the result of judgement obtained from the gain coefficient ratio verification part 24. This error list EL1 is so outputted as to urge the designer to correct the layout pattern.

Figure 7:
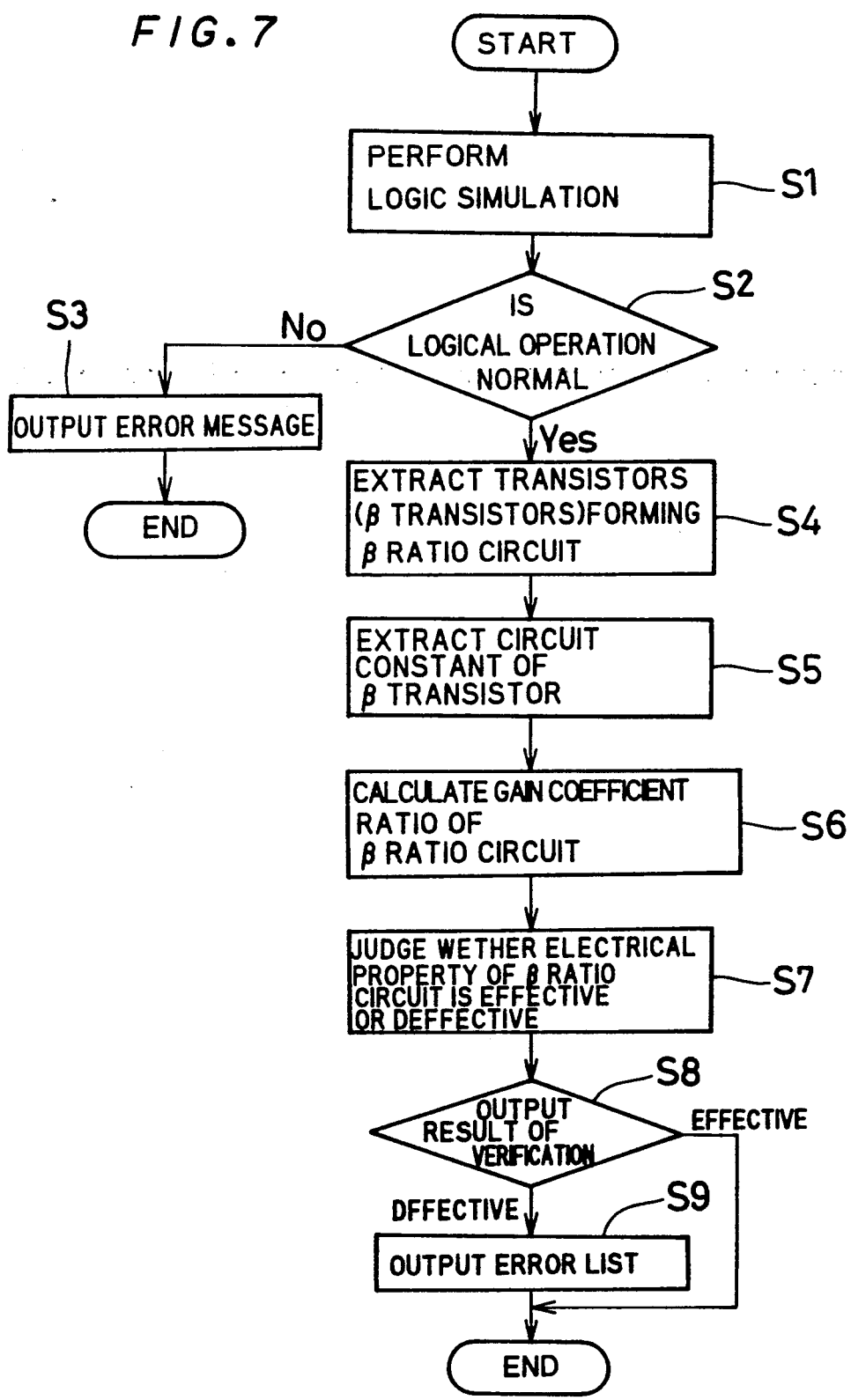
FIG. 7 is a flow chart showing the verification procedure of the layout pattern verification system according to the first embodiment of the present invention.

FIG. 7 is a flow chart showing the verification procedure in the case of implementing the layout pattern verification system of the first embodiment shown in FIG. 4 by a microcomputer. The procedure is now described with reference to FIG. 7.

First, the logic simulation of the logic circuit defined by the circuit connection data d1 is carried out at a step S1. Whether or not the logic circuit can normally operate on logic simulation is verified at a step S2 and then, if cannot normally operate, the error message is output at a step S3 to call the designer's attention to the correction of the circuit connection data d1, to finish the operation.

On the other hand, when it is confirmed at the step S2 that the logic circuit defined by the circuit connection data d1 can normally operate, the operation of a step S4 is entered, wherein transistors (β transistors) forming the ratio circuit are extracted from the circuit connection data d1.

Then, the channel length values and channel width values, which are the circuit constants of the β transistors obtained at the step S4, are extracted from the layout pattern data d2 at a step S5.

Then, the gain coefficient ratio of the transistors is calculated at a step S6 on the basis of the circuit constants of the β transistors obtained at the step S5 and the process parameters d3.

Thereafter the gain coefficient ratio obtained at the step S6 is compared with the margin data d4 at a step S7, hereby to judge whether or not the electrical property of the β ratio circuit is effective or defective.

Then, the process is directly terminated at a step S8 when the result of judgement at the step S7 is "effective", while the error list EL1 is outputted at a step S9 if the judgement is of "defective", to urge the designer to change the layout pattern.

Figure 8:
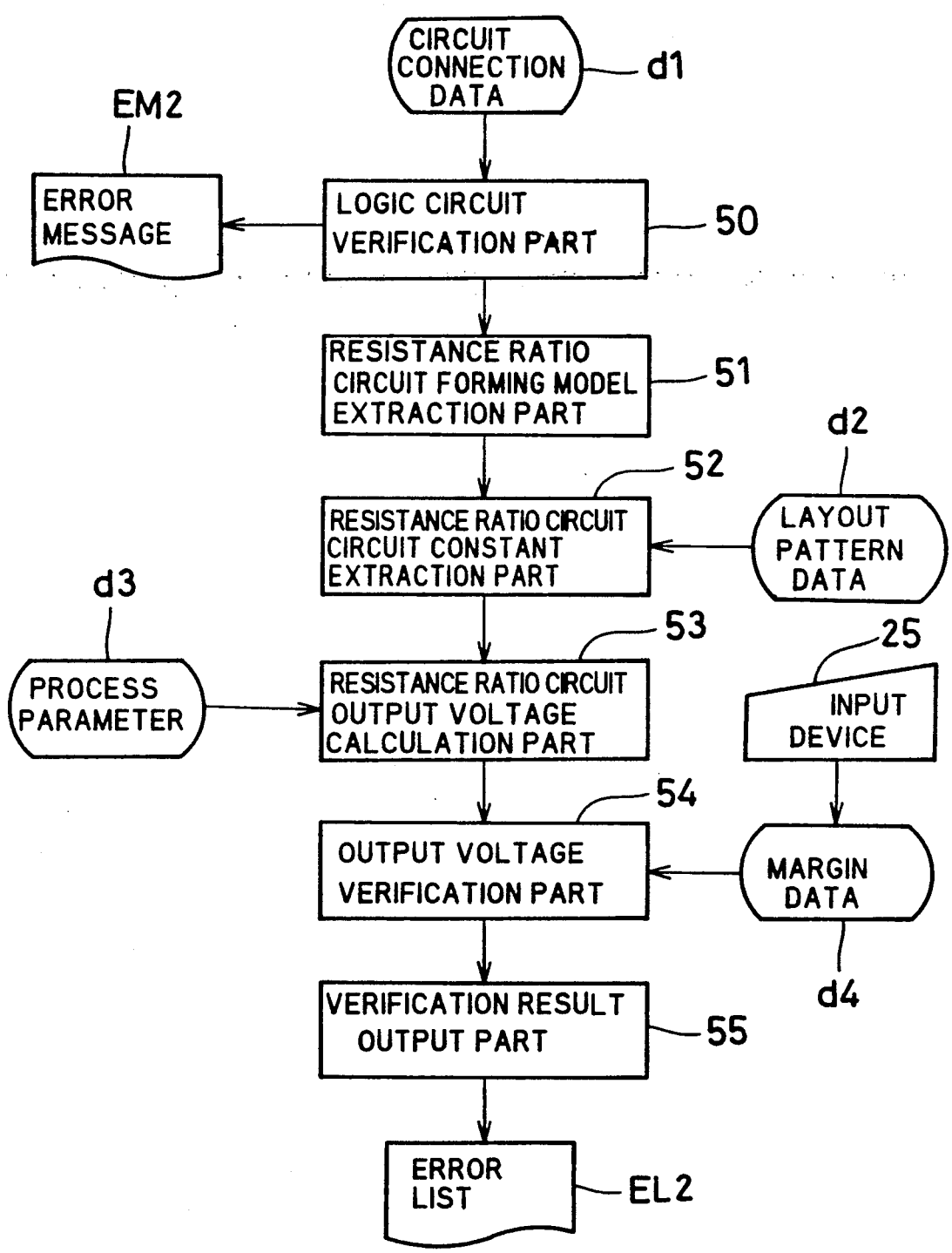
FIG. 8 is a block diagram showing a layout pattern verification system according to a second embodiment of the present invention.

FIG. 8 is a block diagram showing a layout pattern verification system according to a second embodiment of the present invention, which is adapted to verify a resistance ratio in a resistance ratio circuit forming a ratio circuit by the resistance ratio.

Figure 9:
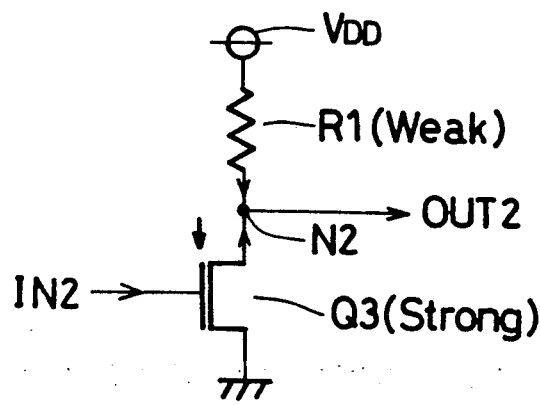
FIG. 9 is a circuit diagram showing an exemplary resistance ratio circuit in circuit connection data.

As shown in the figure, circuit connection data d1 of a logic circuit corresponding to a layout pattern to be subjected to layout verification are taken in a logic circuit verification part 50. FIG. 9 typically shows an exemplary resistance ratio circuit of the circuit connection data d1. As shown in FIG. 9, a resistor R1 and an n-channel MOS transistor Q3, which are connected in series with each other, are interposed between a power source $V_{DD}$ and the ground. The transistor Q3 has a grounded source and a gate to which an input signal IN2 is applied. A signal obtained from a node N2 between the resistor R1 and the drain of the transistor Q3 serves as an output signal OUT2. Further, it is described that an ON resistance value of the transistor Q3 as a charge supplying capability representing value is relatively "small" (signal strength strong) and the resistance value of the resistor R1 is relatively "large" (signal strength=weak).

When a low-level input signal IN2 is inputted in this resistance ratio circuit, a high-level output signal OUT2 is obtained since the transistor Q3 is turned off. When a high-level input signal IN2 is inputted, on the other hand, the transistor Q3 is turned on. Since the resistance value of the resistor R1 is sufficiently larger than the ON resistance value of the transistor Q3, a low level output signal OUT2 is securely obtained from the node N2. Thus, an inverter of the resistance ratio circuit is formed by the resistor R1 and the transistor Q3.

As hereinabove described, the circuit connection data d1 define no dimensional characteristics such as width and length of a diffusion layer forming the resistor R1, channel length and channel width of the transistor Q3 etc. dissimilarly to the conventional circuit connection data D1, but merely explicate that the resistance value of the resistor R1 is sufficiently larger than the ON resistance of the transistor Q3.

The logic circuit verification part 50 verifies whether the logic circuit defined by the aforementioned circuit connection data d1 can correctly operate, by performing logic simulation. Therefore, it is possible to previously confirm whether charge supplying capability representing values and the like of the circuit connection data are correctly described, by the logic circuit verification part 50. That is, the logic circuit verification part 50 conducts logic simulation to output the circuit connection data d1 as it is to the resistance ratio circuit forming element model extraction part 51 when determining that the logical operation of the logic circuit defined by the circuit connection data d is normally performed, and to output an error message EM2 to call the designer's attention to the correction of the circuit connection data d1 when determining that the logical operation is not normally performed.

The resistance ratio circuit forming element model extraction part 51 extracts element models (the resistor R and the transistor Q3 in the example shown in FIG. 9) such as a resistor and a transistor forming the resistance ratio circuit from the circuit connection data d1 verified logic circuit operation shown in FIG. 9, to perform designation of the extracted element models with respect to a resistance ratio circuit constant extraction part 52 of a subsequent stage.

The resistance ratio circuit constant extraction part 52 extracts circuit constants of the resistor, the transistor etc. in the element models designated by the resistance ratio circuit forming element model extraction part 51 from layout pattern data d2.

Figure 10:
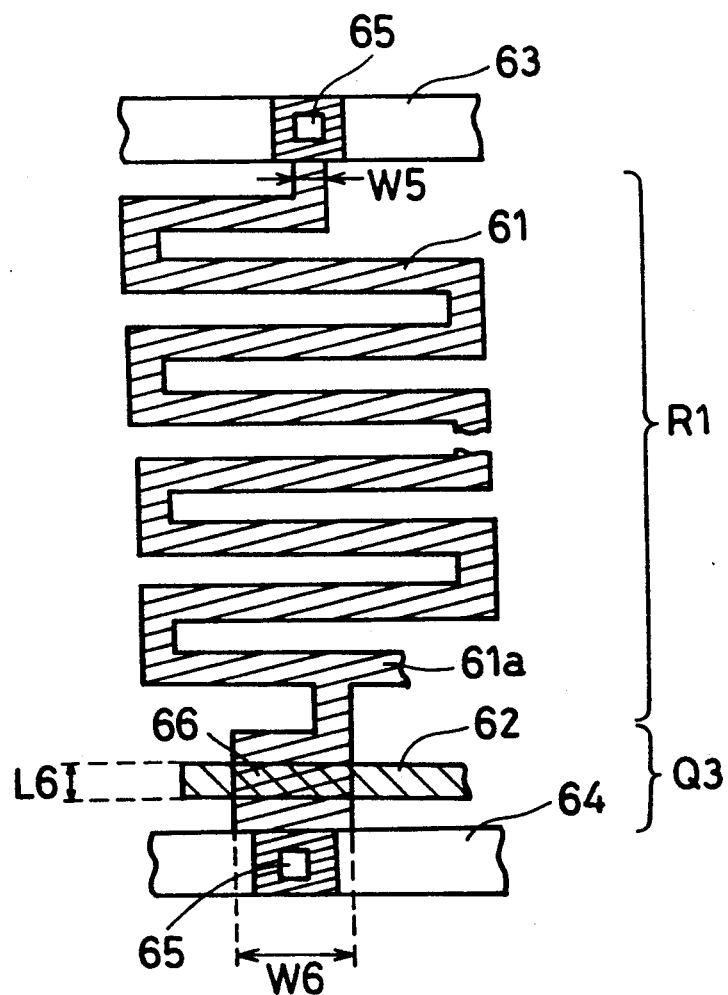
FIG. 10 is a plan view showing layout pattern data corresponding to FIG. 9.

FIG. 10 is a plan view typically showing the layout pattern data d2 in a portion corresponding to the circuit connection data d1 shown in FIG. 9. Referring to the figure, numeral 61 denotes a diffusion region and numeral 62 denotes a polysilicon region, to which an input signal IN2 is applied so that an output signal OUT2 is obtained from a region 61a within the diffusion region 61. Numeral 63 denotes an A1 power supply line, numeral 64 denotes an A1-GND line and numeral 65 denotes a contact part. An overlapping region 66 of the diffusion region 61 and the polysilicon region 62 serves as a gate forming region of the transistor 13. The resistance ratio circuit constant extraction part 52 extracts formation width W5 of the diffusion region 61, formation length L5 (not shown) in which the diffusion region 61 reaches from the A1 power supply line 63 to the transistor Q3, and channel length L6 and channel width W6 of the transistor Q3, which are circuit constants of the resistor R1 and the transistor Q3 in the element models forming the resistance ratio circuit from such layout pattern data d2, and outputs the same to a resistance ratio circuit output voltage calculation part 53 of a subsequent stage.

The resistance ratio circuit output voltage calculation part 53 calculates voltage $V_{OUT2}$ of the output signal OUT2 obtained when the transistor Q3 is turned on in full swing by employing process parameters d3 which are similar to those described above with reference to the first embodiment on the basis of the circuit constants of the element models extracted by the resistance ratio circuit constant extraction part 52. The calculation procedure is no described with reference to the resistance ratio circuit shown in FIGS. 9 and 10.

First, a resistance value $R_l$ of the resistor R1 is obtained from the formation width W5 and the formation length L5 of the diffusion region 61, diffusion concentration of the diffusion region 31 obtained from the process parameters d3 etc.

Then, a gain coefficient $\beta 3$ of the transistor Q3 is obtained from the channel length L6 and the channel width W6 of the transistor Q3 and the constants obtained from the process parameters d3 on the basis of the expression (1), similarly to the first embodiment.

After the resistance value $R_l$ of the resistor R1 and the gain coefficient $\beta 3$ of the transistor Q3 are obtained, voltage $V_{OUT2}$ of an output signal OUT2 obtained when the transistor Q3, which is a driver of the resistance ratio circuit, is turned on in full swing is calculated as hereinafter described. Assuming that $V_{IN}$ represents input voltage with which the transistor Q3 is turned on in full swing, current $I_d$ flowing in the transistor Q3 is expressed as follows:

$$I_d = \beta 3 \cdot \{(V_{IN} - V_{th}) \cdot V_{OUT2} - (V_{OUT2})^2/2\} \quad (2)$$

In the expression (2), threshold voltage $V_{th}$ of the transistor Q3 can be obtained as follows:

$$V_{th} = 2\phi_B + \frac{\sqrt{2\epsilon_0 \epsilon_s q N_A} \cdot \sqrt{2\phi_B}}{C_0} \quad (3)$$

In the expression (3),
$\epsilon_O$: dielectric constant of free space
$\epsilon_S$: specific inductive capacity of semiconductor substrate
q: charge quantity of electrons
$N_A$: impurity concentration of acceptors
$\phi_B$: potential of semiconductor substrate
$C_O$: capacitance of gate oxide film per unit area $(=\epsilon/t_{OX})$ In the expression (3), $\epsilon_O$ and q represent constants held in the resistance ratio circuit output voltage calculation part 53, while $\epsilon_S$, $N_A$, $\phi_B$ and $C_O$ can be obtained from the process parameters d3.

On the other hand, a ON resistance value $R_d$ of the transistor Q3 is determined as follows:

$$R_d = \frac{V_{OUT2}}{I_d} \quad (4)$$

$$= \frac{1}{\beta 3 \{(V_{IN} - V_{th}) - V_{OUT2}/2\}}$$

Assuming that $V_{CC}$ represents source voltage, the output voltage $V_{OUT2}$ is as follows:

$$V_{OUT2} = \frac{R_d}{R_l + R_d} \times V_{CC} \quad (5)$$

Substituting the expression (4) in the expression (5), the output voltage $V_{OUT2}$ is determined as follows:

$$V_{OUT2} = V_{CC} + \frac{1}{R_l + \beta 3} \quad (6)$$

$$= \sqrt{\left((V_{in} - V_{th}) + \frac{1}{R_l \cdot \beta 3}\right)^2 - \frac{2V_{CC}}{R_l \cdot \beta 3}}$$

The output voltage $V_{OUT2}$ can be obtained by substituting input voltage $V_{IN}$ with which the transistor Q3 is turned on in full swing as $V_{CC}$ in the expression (6).

Thus, the resistance ratio circuit output voltage calculation part 53 obtains the voltage $V_{OUT2}$ of the output signal OUT2 developed when the transistor Q3 is turned on in full swing, and outputs the same to the output voltage verification part 54. The output voltage verification part 54 takes in the margin data d4 and compares the same with the output voltage $V_{OUT2}$ taken in from the resistance ratio circuit output voltage calculation part 53, to judge whether the electrical property of the resistance ratio circuit is effective or defective. Similarly to the first embodiment, the margin data d4 is set by the designer inputting the same through an input device 25 in consideration of margins (noise margin etc.) required for normal operation of a logic circuit subsequent to the resistance ratio circuit.

When the voltage $V_{OUT2}$ of the output signal OUT2 obtained when the transistor Q3 is turned on in full swing is set below 2.5 (V) in the resistance ratio circuit shown in FIGS. 9 and 10, for example, the output voltage verification part 54 regards that operating condition is sufficiently satisfied if $V_{OUT2} < 2.5$ and judges that the electrical property of the resistance ratio circuit is "effective". while it judges that the electoral property of the resistance ratio circuit is "defective" if $V_{OUT2} > 2.5$, to output the result of judgement to a verification result output part 55.

The verification result output part 55 outputs an error list EL2 describing a designation specifying the "defective" transistor, the output voltage $V_{OUT2}$ etc. on the basis of the judgement result obtained from the output voltage verification part 54. This error list EL2 is so outputted as to urge the designer to correct the layout pattern.

Figure 11:
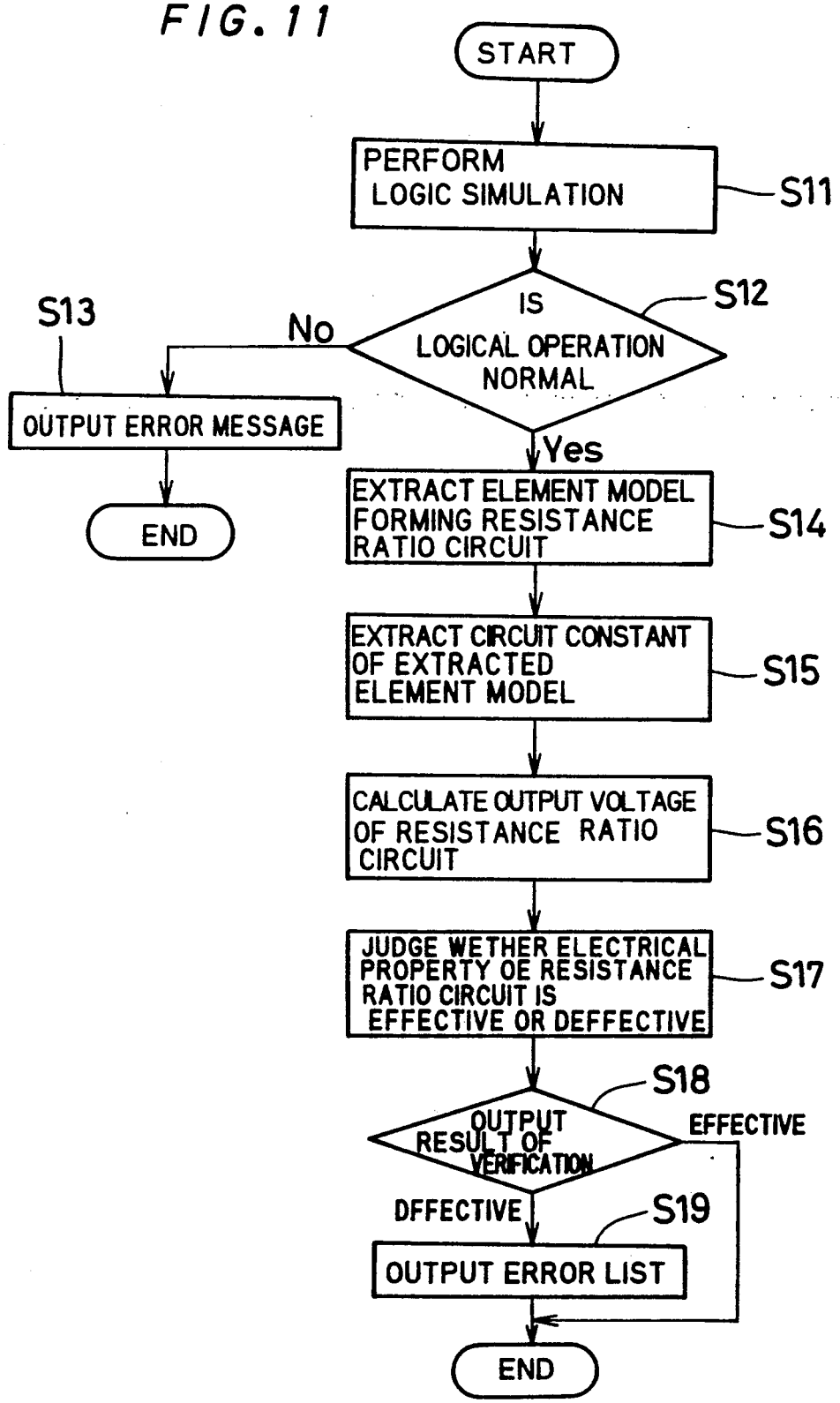
FIG. 11 is a flow chart showing the verification procedure of the layout pattern verification system according to the second embodiment of the present invention.

FIG. 11 is a flow chart showing the verification procedure in the case of implementing the layout pattern verification system according to the second embodiment shown in FIG. 8 by a microcomputer. The procedure is now described with reference to FIG. 11.

First, the logic simulation of the logic circuit defined by the circuit connection data d1 is carried out at a step S11. Whether or not the logic circuit can normally operate on logic simulation is verified at a step S12 and then, if cannot normally operate, the error message is output at e step S13 to call the designer's attention to the correction of the circuit connection data d1 to finish the operation.

On the other hand, when it is confirmed at the step S12 that the logic circuit defined by the circuit connection data d1 can normally operate, the operation of a step S14 is entered, wherein element models such as a resistor, a transistor etc. forming the resistance ratio circuit are extracted from the circuit connection data d1.

Then, diffusion width and diffusion length of a diffusion layer forming the resistor, channel length and channel width of a transistor forming region etc., which are circuit constants of the element models obtained at the step S14, are extracted from the layout pattern data d2 at a step S15.

At a step S16, output voltage obtained when a driver transistor of the resistance ratio circuit is turned on in full swing is calculated on the basis of the circuit constants of the resistance ratio circuit obtained at the step S15 and the process parameters d3.

Thereafter the output voltage obtained at the step S16 is compared with the margin data d4 at a step S17, thereby to judge whether the electrical property of the resistance ratio circuit is effective or defective.

The process is directly terminated at a step S18 when the judgement result obtained at the step S17 is "effective", while the error list EL2 is outputted at a step S19 when the result is "defective", to urge the designer to change the layout pattern.

Figure 12:
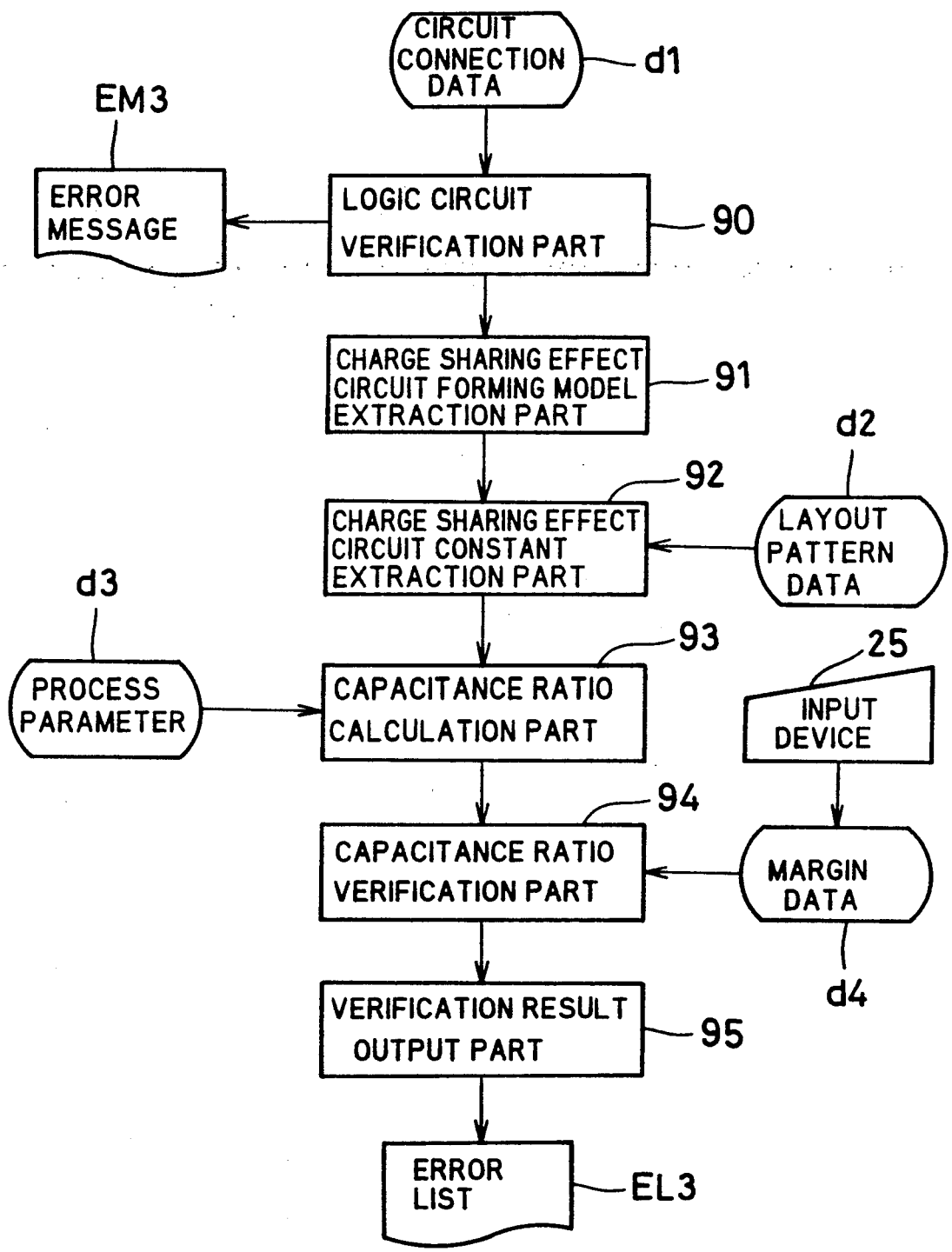
FIG. 12 is a block diagram showing a layout pattern verification system according to a third embodiment of the present invention.

FIG. 12 is a block diagram showing a layout pattern verification system according to a third embodiment of the present invention, which is adapted to verify a capacitance ratio of a charge sharing effect circuit which performs prescribed operation by utilizing the capacitance ratio.

Figure 13:
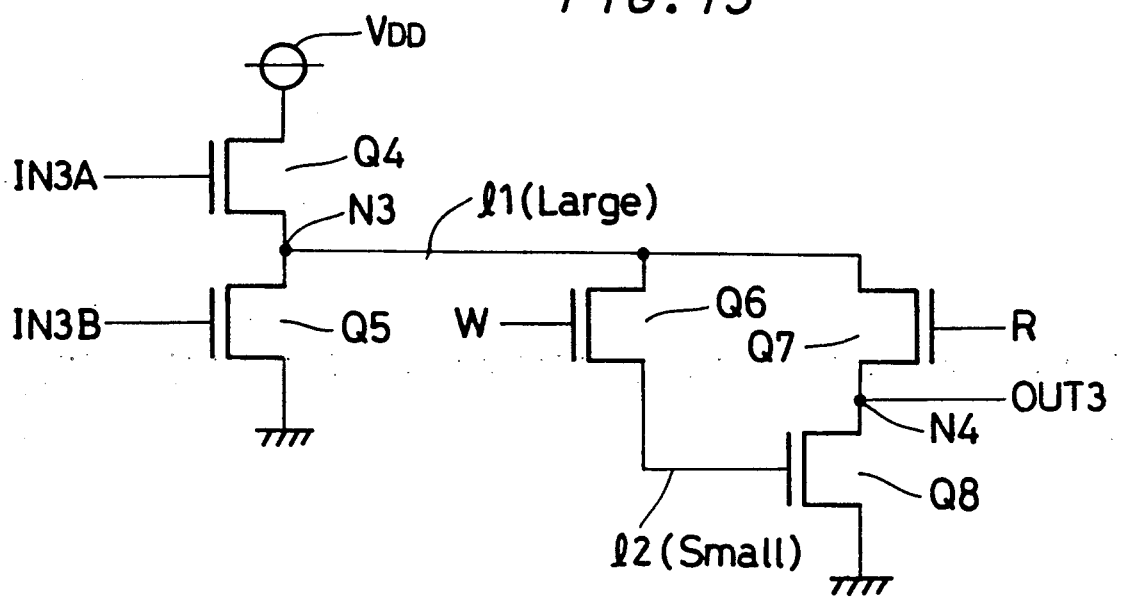
FIG. 13 is a circuit diagram showing an exemplary charge sharing effect circuit in circuit connection data.

As shown in the figure, circuit connection data d1 of a logic circuit corresponding to a layout pattern to be subjected to layout verification are taken in a logic circuit verification part 90. FIG. 13 typically shows an exemplary charge sharing effect circuit of the circuit connection data d1. As shown in FIG. 13, series-connected n-channel MOS transistors Q4 and Q5 are interposed between a power source $V_{DD}$ and the ground. The transistor Q4 has a drain which is connected to the power source $V_{DD}$ and a gate to which an input signal IN3A is applied, while the transistor Q5 has a grounded source and a gate to which an input signal IN3B is applied. Drains of n channel MOS transistors Q6 and Q7 are respectively connected to a node N3 between the source of the transistor Q4 and the drain of the transistor Q5 through a signal line 11.

A write signal W is applied to the gate of the transistor Q6, whose source is connected to the gate of an n-channel MOS transistor Q8 having a grounded source through a signal line 12. On the other hand, a read signal R is applied to the gate of the transistor Q7, whose source is connected to the drain of the transistor Q8. A signal obtained from a node N4 between the source of the transistor Q7 and the drain of the transistor Q8 serves as an output signal OUT3. Further, it is described that capacitance C1 accompanying the signal line 11 as a charge supplying capability representing value is relatively "large" and capacitance C2 accompanying the signal line 12 is relatively "small".

When both of the input signals IN3A and IN3B are converted to low levels after one of the signals is made high and the other one is made low for a prescribed period in this charge sharing effect circuit, high or low level charges are stored in the signal line 11 in response to one of the transistors Q4 and Q5 which is turned on.

Thereafter the write signal W is made high and the transistor Q6 is strongly turned on to supply the charges stored in the signal line 11 to the signal line 12, thereby to perform writing in the signal line 12. An on or off state of the transistor Q8 is determined in response to the charges stored in the signal line 12.

When the read signal R is made high after the aforementioned writing, a low-level output signal OUT3 is outputted if the transistor Q8 is in an on state while a high-level output signal OUT3 is outputted if the transistor Q8 is in an off state, whereby contents stored in the signal line 12 can be read out.

Thus, the circuit shown in FIG. 13 can perform memory operation on the premise that the capacitance C1 accompanying the signal line 11 is "larger" than the capacitance C2 accompanying the signal line 12, i.e., that charge supply capability of the signal line 11 is sufficiently larger than that of the signal line 12. This is because sufficient charges cannot be supplied from the signal line 11 to the signal line 12 in writing (write signal W="H") if C1<C2.

As hereinabove described, the circuit connection data d1 define no dimensional characteristics such as channel length values and channel width values of the transistors Q4 to Q8, formation width values and formation length values of the signal lines 11 and 12 and the like similarly to the first and second embodiments, but merely explicate that the capacitance C1 accompanying the signal line 11 is larger than the capacitance C2 accompanying the signal line 12.

The logic circuit verification part 90 verifies whether the logic circuit defined by the aforementioned circuit connection data d1 can correctly operate, by performing logic simulation. Therefore, it is possible to previously confirm whether charge supplying capability representing values and the like of the circuit connection data are correctly described, by the logic circuit verification part 90. That is, the logic circuit verification part 90 conducts logic simulation to output the circuit connection data d1 as it is to the charge sharing effect circuit forming element model extraction part 91 when determining that the logical operation of the logic circuit defined by the circuit connection data d1 is normally performed, and to output an error message EM3 to call the designer's attention to the correction of the circuit connection data d1 when determining that the logical operation is not normally performed.

The charge sharing effect circuit forming element model extraction part 91 extracts element models (the signal lines 11 and 12 and the transistors Q4 to Q8 connected to the signal lines 11 and 12 in the example shown in FIG. 13) forming the charge sharing effect circuit from the circuit connection data d1 verified its logical circuit operation shown in FIG. 13, and designates the extracted element models with respect to a charge sharing effect circuit constant extraction part 92 of a subsequent stage. The charge sharing effect circuit constant extraction part 92 extracts circuit constants of the element models designated by the charge sharing effect circuit forming element model extraction part 91 from layout pattern data d2 and outputs the same to a capacitance ratio calculation part 93 of a subsequent stage. The circuit constants of the element models are contact areas A1 and A2 between the signal lines 11 and 12 and insulating films formed under the signal lines 11 and 12, width values a4 to a8, length values b4 to b8 and gate areas A4 to A8 of drain (source) diffusion regions of the transistors Q4 to Q8 and the like in the circuit shown in FIG. 13.

The capacitance ratio calculation part 93 takes in process parameters d3 required for calculation, and calculates the capacitance ratio of the charge sharing effect circuit on the basis of the circuit constants obtained from the charge sharing effect circuit constant extraction part 92. The calculation procedure is now described with reference to the circuit shown in FIG. 13.

The capacitance C1 accompanying the signal line 1 is determined as follows:

$$C1 = C_{l1} + C_{S4} + C_{D5} + C_{D6} + C_{D7} \quad (7)$$

Figure 14:
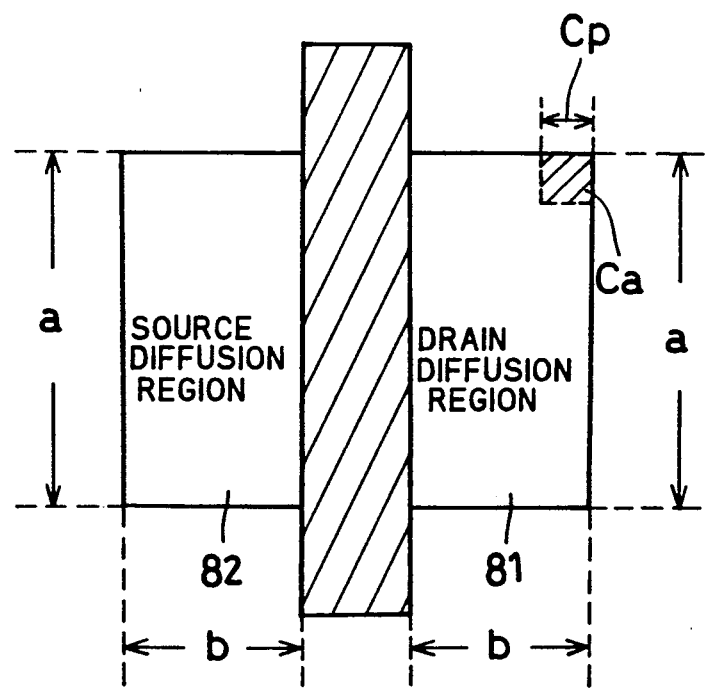
FIG. 14 is an explanatory diagram of drain (source) diffusion capacitance.

In the expression (7), $C_{l1}$ represents interconnection capacitance of a capacitor formed by the signal line 11, the insulating film formed under the signal line 11 and a semiconductor layer formed under the insulating film, which can be calculated as follows:

$$C_{l1} = \frac{\epsilon 1}{t1} \cdot A1 \quad (8)$$

where $\epsilon 1$: dielectric constant of insulating film $t1$: thickness of insulating film The above $\epsilon 1$ and $t1$ can be obtained from the process parameters d3, and A1 can be obtained from the layout pattern data d2 as hereinabove described. In the expression (7), on the other hand, $C_{S4}$ represents source diffusion capacitance of the transistor Q4, and $C_{D5}$ to $C_{D7}$ represent drain diffusion capacitance values of the transistors Q5 to Q7 respectively. In general, drain (source) diffusion capacitance $C_d$ can be calculated as follows:

$$C_d = a \cdot b \cdot C_a + 2(a+b)C_p \quad (9)$$

where $C_a$: junction capacitance of drain (source) diffusion region 81 (82) and semiconductor layer immediately under the same per unit area (see FIG. 14)

$C_p$: junction capacitance of drain diffusion region 81 (82) and semiconductor layer around the same per unit area (see FIG. 14)

a: width of drain (source) diffusion region 81 (82) (see FIG. 14)

b: length of drain (source) diffusion region 81 (82) (see FIG. 14)

In the expression (9), $C_a$ and $C_p$ are determined by the process parameters d3 and the conductivity types of the transistors Q4 to Q8. The conductivity types of the transistors 04 to Q8 can be obtained by conductivity types of diffusion regions forming the transistors Q4 to Q8 respectively in the layout pattern data d2. Further, a and b can be extracted from the layout pattern data d2, as herienabove described. The expression (9) can be applied to all of $C_{S4}$ and $C_{D5}$ to $C_{D7}$.

The capacitance C2 accompanying the signal line 2 is determined as follows:

$$C2 = C_{l2} + C_{D6} + C_{G8} \quad (10)$$

In the expression (10), $C_{l2}$ represents interconnection capacitance of a capacitor formed by the signal line 12, the insulating film formed under the signal line 12 and a semiconductor layer formed under the insulating film, which can be calculated as follows:

$$C_{l2} = \frac{\epsilon 2}{t2} \cdot A2 \quad (11)$$

where

E2: dielectric constant of insulating film t2: thickness of insulating film $\epsilon 3$ and $t2$ can be obtained from the process parameters d3, and A2 can be obtained from the layout pattern data d2, as hereinabove described.

In the expression (10), on the other hand, $C_{D6}$ represents drain diffusion capacitance of the transistor Q6 which can be calculated by the expression (9), while $C_{G8}$ represents MOS gate capacitance of the transistor Q8, which can be calculated by the following expression (12):

$$C_{GT} = C_0 \cdot A8 \quad (12)$$

$C_0(=\epsilon/t_{Ox})$ can be obtained from the process parameters d3 similarly to the second embodiment, and A8 can be obtained from the layout pattern data d2, as herienabove described.

Through the aforementioned expressions (7) to (12), the capacitance ratio calculation part 93 obtains the capacitance ratio C2/C1 relating to the signal lines 11 and 11.

Thus, the oapaoitance ratio calculation part 93 obtains the capaoitance ratio of the charge sharing effect circuit, and outputs the same to a capacitance ratio verification part 94. The capacitance ratio verification part 94 takes in margin data d4 and compares the same with the capacitance ratio taken in from the capacitance ratio calculation part 93, to judge whether the charge sharing effect circuit is effective or defective. The margin data d4 is set by the designer inputting the same through an input device in consideration of margins required for normal operation of the charge sharing effect circuit.

When the capacitance ratio C2/C1 between the capacitance C1 accompanying the signal line 11 and the capacitance C2 accompanying the signal line 12 is set below 1/M (M>1), for example, in the charge sharing effect circuit shown in FIG. 13, the capacitance ratio verification part 94 regards that operating condition is sufficiently satisfied if the capacitance ratio C2/C1 is less than 1/M and judges that the electrical property of the charge sharing effect circuit is "effective", while it judges that the electrical property of the charge sharing effect circuit is "defective" if C2/C1>1/M, to output the judgement result to a verification result output part 95.

The verification result output part 95 outputs an error list EL3 describing designations specifying the element models, the capacitance ratio and designations specifying peripheral element models when a judgement result of "defective" is obtained on the basis of the result obtained from the capacitance ratio verification part 94. This error list EL3 is so outputted as to urge the designer to correct the layout pattern data.

Figure 15:
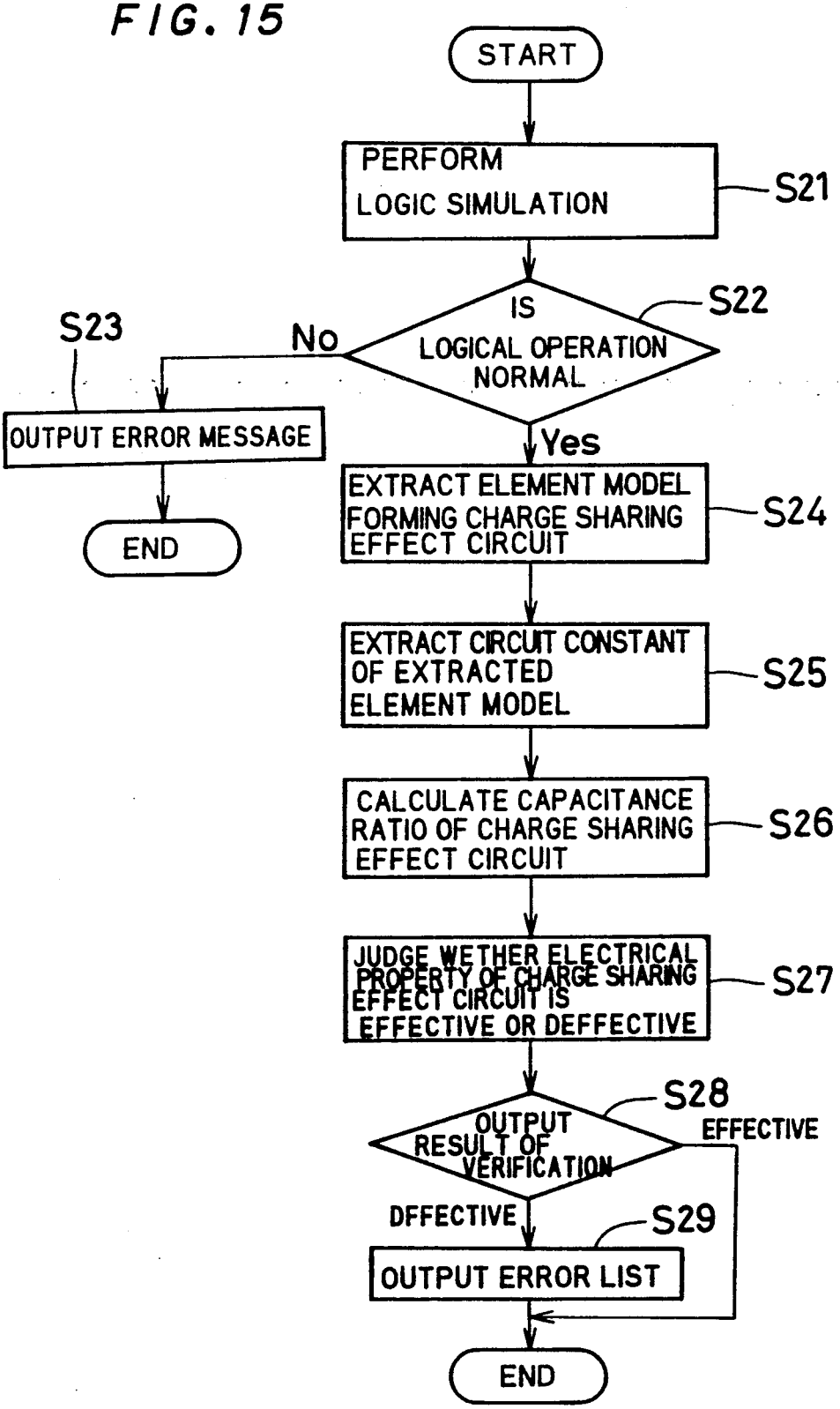
FIG. 15 is a flow chart showing the verification procedure of the layout pattern verification system according to the third embodiment of the present invention.

FIG. 15 is a flow chart showing the verification procedure in the case of implementing the layout pattern verification system for capacitance ratio verification according to the third embodiment shown in FIG. 12. The procedure is now described with reference to FIG. 15.

First, the logic simulation of the logic circuit defined by the circuit connection data d1 is carried out at a step S21. Whether or not the logic circuit can normally operate on logic simulation is verified at a step S22 and then, if cannot normally operate, the error message is output at a step S23 to call the designer's attention to the correction of the circuit connection data d1, to finish the operation On the other hand, when it is confirmed at the step S22 that the logic circuit defined by the circuit connection data d1 can normally operate, the operation of a step S24 is entered, wherein element models forming the charge sharing effect circuit are extracted from the circuit connection data d1 at a step S24.

Then, formation width values and formation length values of signal lines, formation width values and formation length values of drain diffusion regions of transistors, channel conductivity types and the like, which are circuit constants of the charge sharing effect circuit obtained at the step S24, are extracted from the layout pattern data d2 at a step S25.

At a step S26, the capacitance ratio between two or more element models such as signal lines, to which large-small-relation of the capacitance ratio is required, is calculated on the basis of the circuit constants of the charge sharing effect circuit obtained at the step S25 and the process parameters d3.

Thereafter the capacitance ratio obtained at the step S26 is compared with the margin data d4 at a step S27, thereby to judge whether the electrical property of the charge sharing effect circuit is effective or defective.

Then, the process is directly terminated at a step S28 when the judgement result obtained at the step S27 is "effective", while the error list EL3 is outputted at a step S29 when the result is "defective", to urge the designer to change the layout pattern.

Figure 16:
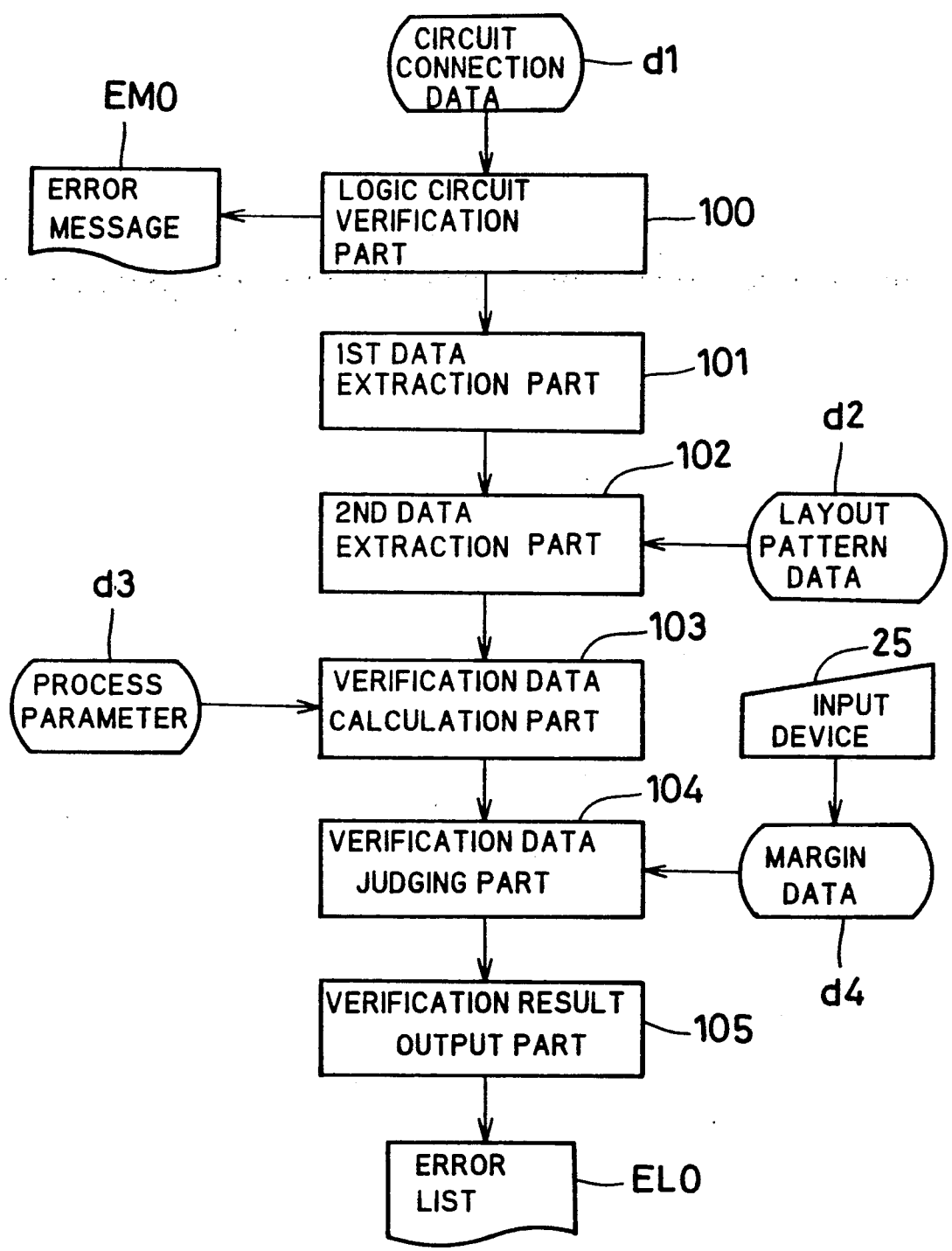
FIG. 16 is a block diagram showing a layout pattern verification system including the first to third embodiments.

FIG. 16 is a block diagram showing a layout pattern verification system including the first to third embodiments of the present invention.

As shown in the figure, circuit connection data d1 of a logic circuit corresponding to a layout pattern to be subjected to layout verification are taken in a logic circuit verification part 100. The logic circuit verification part 100 performs the logic simulation of the logic circuit defined by the circuit connection data d1 to verify the normality/abnormality of the logical operation thereof. When it is determined that the logical operation is normal, the circuit connection data d1 is output as it is to first data extraction part 101, and when it is determined that the logical operation is abnormal, an error message EMO is output to call the designer's attention to message EMO is output to call the designer the correction of the circuit connection data d1.

The first data extraction part 101 extracts at least two verification elements (transistor, resistor, signal line having capacitor function etc.) employed for a β ratio circuit, a resistance ratio circuit, a charge sharing effect circuit or the like, which requires provision of prescribed large-small relation in charge supply capability (gain coefficient, resistance value and capacitance value of transistor etc.) from the circuit connection data d1, and designates the extracted verification elements with respect to a second data extraction part 102 of a subsequent stage.

The second data extraction part 102 extracts reference circuit constants (channel length and channel width in the first embodiment as well as the aforementioned ones in the second and third embodiments etc.), which are circuit constants relating to charge supply capability of the verification elements designated by the first data extraction part 101, from layout pattern data d2, and outputs the same to a verification data calculation part 103 of a subsequent stage.

The verification data calculation part 103 calculates verification data (gain coefficient ratio, output voltage, capacitance ratio etc.) expressing the charge supply capability ratio of the verification elements on the basis of process parameters d3 and the reference circuit constants obtained from the second data extraction part 102, and outputs the same to a verification data judging part 104 of a subsequent stage.

The verification data judging part 104 takes in margin data d4, and compares the same with the verification data obtained from the verification data calculation part 103 to judge whether the electrical property of the logic circuit formed by the designed layout pattern is effective or defective, and outputs the judgement result to a verification result output part 105. The margin data d4 are set by a designer from an input device 25 in consideration of margins required for preventing malfunction of the overall circuit.

The verification result output part 105 outputs an error list ELO describing the verification elements and the verification data when the judgement result obtained from the verification data judging part 104 is "defective". This error list ELO is so outputted as to urge the designer to correct the layout pattern.

Thus, the layout pattern verification system according to the present invention can verify the electrical property of a logic circuit formed by layout pattern data by extracting at least two verification elements, whose large-small-relation of charge supply capability is defined, from the circuit connection data d1 and the layout pattern data d2 and calculating verification data relating to charge supply capability of the verification elements.

Consequently, it is not necessary to execute large-scale circuit simulation through circuit connection data of a logic circuit corresponding to a layout pattern dissimilarly to the conventional case, whereby the electrical property of the layout pattern of a large-scale logic circuit can be relatively simply verified.

Further, effectiveness/defectiveness of the electrical property of a logic circuit formed by a layout pattern can be verified in accordance with various dimensional characteristics obtained from designed layout pattern data even if the circuit connection data d1 have no dimensional characteristics such as channel length, channel width etc. of transistors dissimilarly to the conventional case, whereby there is no need to define dimensional characteristics in the circuit connection data d1 dissimilarly to the conventional case, and only "large" or "small" may be defined in the elements in relation to charge supply capability when it is necessary to provide large-and-small relation in charge supply capability.

Thus, even if formation width etc. of aluminum interconnection and a polysilicon layer are refined and a design rule of the wafer process is changed by technical development, it is not necessary to change circuit connection data d1 themselves following refinement of elements since there is no need to originally define dimensional characteristics in the circuit connection data d1.

Further, the verification of electrical characteristics of layout pattern data never carried out on the basis of falsely described circuit connection data since the logic verification of the circuit connection data itself of a logic circuit corresponding to the layout pattern is performed prior to the verification of the electrical characteristics of the logic circuit formed by the layout pattern data.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A layout pattern verification system for verifying the electrical property of a layout pattern forming a prescribed logic circuit, said layout pattern verification system comprising:
   circuit connection data supply means for supplying circuit connection data defining a connection relationship among elements forming said logic circuit and a large-small charge supplying capability relationship of specific ones of said elements;
   layout pattern data supply means for supplying layout pattern data defining said layout pattern of said logic circuit;
   process parameter supply means for supplying various process parameters required for fabricating said logic circuit;
   first data extraction means for extracting said specific ones of said elements whose large-small charge supplying capability relationship is defined form said circuit connection data as verification elements;
   second data extraction means for extracting circuit constants relating to charge supplying capability of said verification elements from said layout pattern data as reference circuit constants;
   verification data calculation means for calculating verification data expressing a charge supplying capability ratio of said verification elements on the basis of said reference circuit constants and said process parameters; and
   verification data judging means for judging effectiveness/defectiveness of the electrical property of said logic circuit formed by said layout pattern on the basis of said verification data.

2. A layout pattern verification system in accordance with claim 1, wherein
   said verification data judging means judges the effectiveness/defectiveness of the electrical property of said logic circuit by comparing said verification data with reference data.

3. A layout pattern verification system in accordance with claim 2, further comprising
   verification result output means for outputting a judgment result on the basis of the judgment result of said verification data judging means while outputting said specific elements and said verification data upon the defectiveness of said judgment result.

4. A layout pattern verification system in accordance with claim 3, wherein
   said circuit connection data supply means includes logical operation verification means for performing logic simulation of a logic circuit defined by said circuit connection data to verify logical operation thereof.

5. A layout pattern verification system in accordance with claim 4, wherein
   said specific elements include transistors forming a $\beta$ ratio circuit, and
   said verification data includes a gain coefficient ratio of transistors forming said $\beta$ ratio circuit.

6. A layout pattern verification system in accordance with claim 5, wherein
   said $\beta$ ratio circuit includes an inverter.

7. A layout pattern verification system in accordance with claim 4, wherein
   said specific elements include elements forming a resistance ratio circuit, and
   said verification data include a value on the basis of a resistance ratio of elements forming said resistance ratio circuit.

8. A layout pattern verification system in accordance with claim 7, wherein
   said elements forming said resistance ratio circuit include a transistor and a resistor.

9. A layout pattern verification system in accordance with claim 8, wherein
   said resistance ratio circuit includes an inverter.

10. A layout pattern verification system in accordance with claim 4, wherein
    said specific elements include capacitors forming a charge sharing effect circuit which performs predetermined operation by utilizing a capacitance ratio, and
    said verification data includes a capacitance ratio of said capacitors forming said charge sharing effect circuit.

11. A layout pattern verification system in accordance with claim 10, wherein
    said capacitors forming said charge sharing effect circuit includes a capacitor accompanying a signal line.

* * * * *